(12) United States Patent
Lee (10) Patent No.: US 10,311,956 B2
(45) Date of Patent: Jun. 4, 2019

(54) SEMICONDUCTOR MEMORY DEVICE AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/884,654

(22) Filed: Jan. 31, 2018

(65) Prior Publication Data

US 2019/0013078 A1    Jan. 10, 2019

(30) Foreign Application Priority Data

Jul. 10, 2017  (KR) .................. 10-2017-0087184

(51) Int. Cl.
| | | |
|---|---|---|
| *G11C 11/34* | (2006.01) | |
| *G11C 16/10* | (2006.01) | |
| *G11C 16/30* | (2006.01) | |
| *G11C 16/34* | (2006.01) | |
| *G11C 16/08* | (2006.01) | |

(52) U.S. Cl.
CPC .............. *G11C 16/10* (2013.01); *G11C 16/30* (2013.01); *G11C 16/3459* (2013.01); *G11C 16/08* (2013.01)

(58) Field of Classification Search
CPC . H01L 27/115; H01L 27/11521; G11C 16/10; G11C 16/0416; G11C 16/0483
USPC ............. 365/185.11, 185.18, 230.03, 189.04
See application file for complete search history.

(56) References Cited

U.S. PATENT DOCUMENTS

| | | | | |
|---|---|---|---|---|
| 8,817,535 | B1* | 8/2014 | Yang ................... | G11C 11/5628 365/185.03 |
| 2012/0081959 | A1* | 4/2012 | Lee ...................... | G11C 11/5642 365/185.09 |
| 2012/0155168 | A1* | 6/2012 | Kim ........................ | G11C 5/14 365/185.03 |
| 2016/0141035 | A1* | 5/2016 | Shim ..................... | G11C 16/10 365/185.11 |

FOREIGN PATENT DOCUMENTS

KR         101634340 B1    6/2016
KR         1020170011324 A  2/2017

* cited by examiner

*Primary Examiner* — Son T Dinh
(74) *Attorney, Agent, or Firm* — William Park & Associates Ltd.

(57) ABSTRACT

Disclosed are a semiconductor memory device and a method of operating the same. The semiconductor memory device includes a memory cell array including a plurality of memory cells which are programmed to a plurality of program states, a peripheral circuit configured to perform a program operation on the memory cell array, and a control logic configured to control the peripheral circuit to divide the plurality of program states into two or more program groups and sequentially program the two or more program groups during the program operation, wherein the control logic controls the peripheral circuit to simultaneously program the memory cells which are to be programmed to program states included in the same program group among the plurality of memory cells.

15 Claims, 8 Drawing Sheets

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2017-0087184 filed on Jul. 10, 2017 in the Korean Intellectual Property Office, the entire disclosure of which is incorporated herein by reference.

BACKGROUND

1. Technical Field

The present disclosure relates to an electronic device, and more particularly, to a semiconductor memory device and an operating method thereof.

2. Related Art

A semiconductor memory device among semiconductor devices is generally classified into a volatile memory device and a nonvolatile memory device.

The nonvolatile memory device has a relatively low write and read rate, but maintains stored data even though power supply is blocked. Accordingly, the nonvolatile memory device is used in order to store data which needs to be maintained regardless of the power supply. The nonvolatile memory device includes a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

The flash memory has an advantage over RAM, in that data is freely programmed and erased, and an advantage over ROM, in that stored data can be maintained even though power supply is blocked. The flash memory is widely used as a storage medium of a portable electronic device, such as a digital camera, a Personal Digital Assistant (PDA), and an MP3 player.

SUMMARY

The present disclosure has been made in an effort to solve the above-described problems associated with the prior art, and provides a semiconductor memory device, which is capable of improving a program speed during a program operation of the semiconductor memory device, and an operating method thereof.

An example embodiment of the present disclosure provides a semiconductor memory device, including: a memory cell array including a plurality of memory cells which are programmed to a plurality of program states; a peripheral circuit configured to perform a program operation on the memory cell array; and a control logic configured to control the peripheral circuit to divide the plurality of program states into two or more program groups and sequentially program the two or more program groups during the program operation, wherein the control logic controls the peripheral circuit to simultaneously program the memory cells which are to be programmed to program states included in the same program group among the plurality of memory cells.

Another example embodiment of the present disclosure provides a semiconductor memory device, including: a memory cell array including a plurality of memory cells which are programmed to a plurality of program states; a peripheral circuit configured to perform a program operation on the memory cell array; and a control logic configured to control the peripheral circuit to group the plurality of program states into a first program group and a second program group, and perform a program operation on the first program group and then perform a program operation on the second program group during the program operation.

Yet another example embodiment of the present disclosure provides a method of operating a semiconductor memory device, the method including: receiving a plurality of data to be programmed from outside the semiconductor device and storing the received data in a read and write circuit connected with bit lines of a memory cell array; grouping the plurality of data into a plurality of program groups; performing a program operation on a selected program group among the plurality of program groups; and when a program operation for the selected program group is completed, performing a program operation on a next program group.

According to the present exemplary embodiments of the present disclosure, during a program operation of the semiconductor device, input data is divided into two or more groups according to a program state and the respective groups are sequentially programmed, and memory cells corresponding to the program states included in each group are simultaneously programmed, thereby improving a program speed.

BRIEF DESCRIPTION OF THE DRAWINGS

Example embodiments will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Advantages and features of the present disclosure and methods of achieving the advantages and features will be clear with reference to example embodiments described in detail below together with the accompanying drawings. However, the present disclosure is not limited to the example embodiments described herein, and may be implemented in various different forms. However, the example embodiments described herein are provided to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
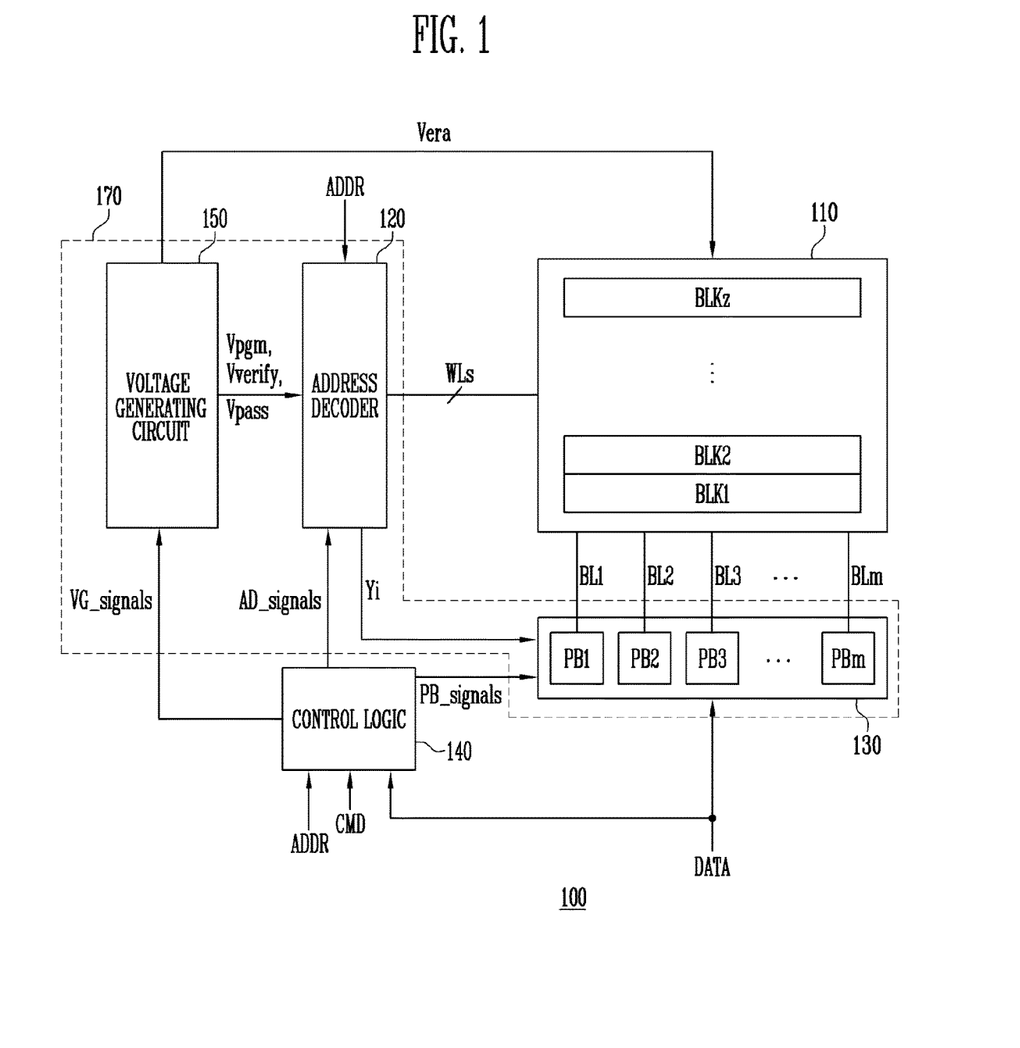
FIG. 1 is a block diagram for describing a semiconductor memory device according to an example embodiment of the present disclosure.

FIG. 1 is a block diagram illustrating a semiconductor memory device according to the present disclosure.

Referring to FIG. 1, a semiconductor memory device 100 includes a memory cell array 110, an address decoder 120, a read and write circuit 130, a control logic 140, and a voltage generator or voltage generating circuit 150.

The address decoder 120, the read and write circuit 130, and the voltage generator 150 may be defined as a peripheral circuit 170 for performing general operations, such as a program operation, an erase check operation, and a read operation, on the memory cell array 110.

The memory cell array 110 includes a plurality of memory blocks BLK1 to BLKz. The plurality of memory blocks BLK1 to BLKz are connected to the address decoder 120 through word lines WLs. The plurality of memory blocks BLK1 to BLKz are connected to the read and write circuit 130 through bit lines BL1 to BLm. In the example embodiment, the plurality of memory cells may be nonvolatile memory cells based on a charge trap device. The plurality of memory cells which are commonly connected to the same word line may be defined as one page. The memory cell array 110 is formed of a plurality of pages.

A detailed configuration of the memory cell array 110 will be described later.

The address decoder 120 is connected to the memory cell array 110 through the word lines WLs. The address decoder 120 is configured to be operated in response to control signals AD_signals output from the control logic 140. The address decoder 120 receives an address ADDR through an input/output buffer (not illustrated) inside the semiconductor memory device 100. The address decoder 120 applies a program voltage Vpgm to a selected word line among the word lines WLs and applies a pass voltage Vpass to the unselected word lines according to a received address during a program operation. Further, during a program verify operation, the address decoder 120 applies a verify voltage Vverify to a selected word line and applies a pass voltage Vpass to the unselected word lines.

Further, the address ADDR received during various general operations including a program operation, a read operation, and an erase operation of the semiconductor memory device 100 includes a block address, a row address, and a column address. The address decoder 120 selects one memory block and one word line according to the block address and the row address. A column address Yi is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The plurality of page buffers PB1 to PBm is connected to the memory cell array 110 through the bit lines BL1 to BLm. The plurality of page buffers PB1 to PBm may adjust potential levels of the corresponding bit lines BL1 to BLm according to data to be programmed during a program operation, respectively. For example, each of the plurality of page buffers PB1 to PBm applies a program inhibition voltage (for example, a power voltage) to a corresponding bit line when the corresponding memory cell is a program prohibition cell during the program operation, and adjusts a potential level of a program allowable voltage according to a program state corresponding to data to be programmed and applies the program allowable voltage when the corresponding memory cell is a program cell.

Further, the plurality of page buffers PB1 to PBm precharges the potential levels of the bit lines BL1 to BLm to predetermined levels, respectively, and senses the potential levels or the current quantities of the bit lines BL1 to BLm and determines whether the program operation passes or fails.

The read and write circuit 130 is operated in response to control signals PB_signals output from the control logic 140.

The control logic 140 is connected to the address decoder 120, the read and write circuit 130, and the voltage generator 150. The control logic 140 receives a command CMD, data DATA, and an address ADDR through the input/output buffer (not illustrated) of the semiconductor memory device 100. The control logic 140 is configured to control various general operations including the program operation, the read operation, and the erase operation of the semiconductor memory device 100 in response to the command CMD.

Further, the control logic 140 may group the data DATA input together with the command CMD into a plurality of program groups according to a program state, and control the address decoder 120, the read and write circuit 130, and the voltage generating circuit 150 to sequentially program each program group.

Further, the control logic 140 may control the read and write circuit 130 to adjust a potential level of a program allowable voltage applied to a bit line corresponding to a program group according to a program state during a program operation of each program group.

The control logic 140 generates and outputs control signals AD_signals for controlling the address decoder 120, control signals PB_signals for controlling the read and write circuit 130, and control signals VG_signals for controlling the voltage generating circuit 150, in response to the command CMD.

The voltage generating circuit 150 is operated in response to control signals VG_signals output from the control logic 140.

The voltage generating circuit 150 generates and outputs a program voltage Vpgm and a pass voltage Vpass during a program operation, generates and outputs a verify voltage Vverify and a pass voltage Vpass during a verify operation, and generates and outputs an erase voltage Vera during an erase operation.

Figure 2:
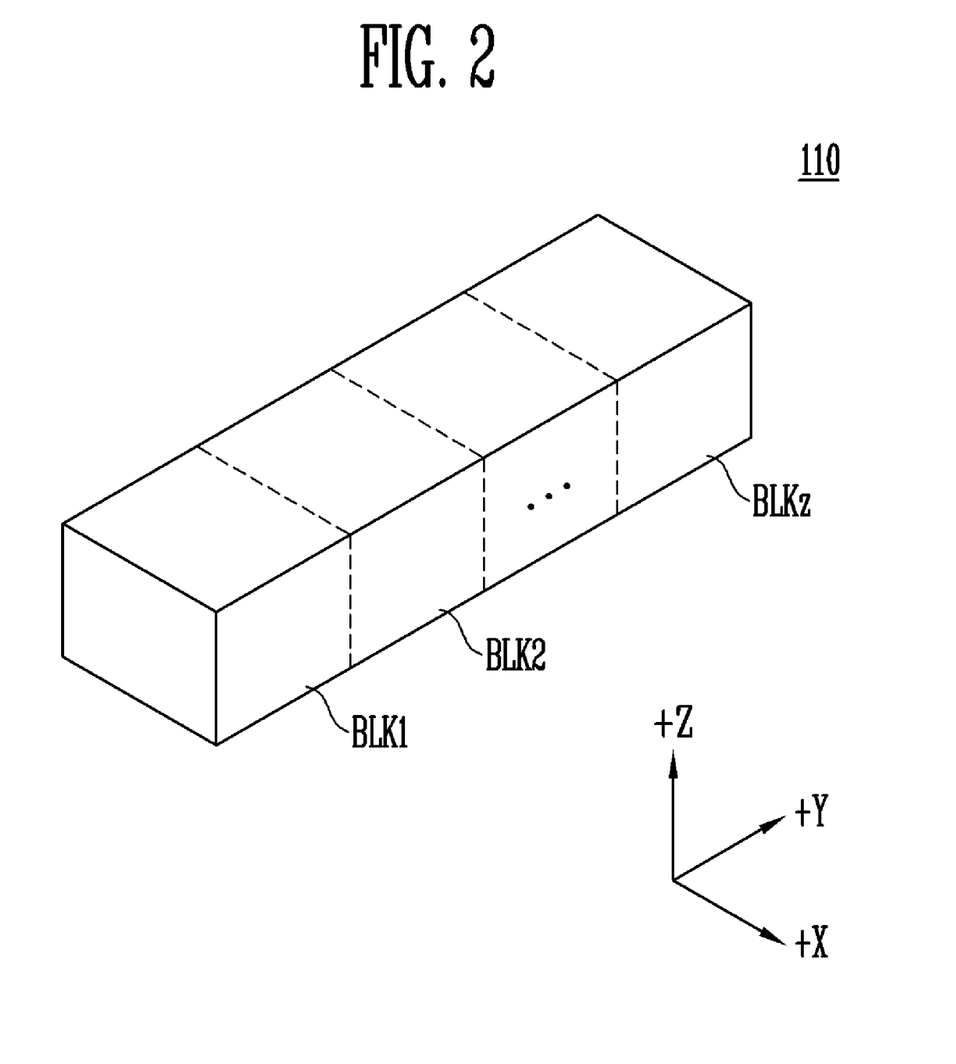
FIG. 2 is a block diagram illustrating an example embodiment of a memory cell array of FIG. 1.

FIG. 2 is a block diagram illustrating an example embodiment of a memory cell array 110 of FIG. 1.

Referring to FIG. 2, the memory cell array 110 includes the plurality of memory blocks BLK1 to BLKz. Each of the memory blocks has a three-dimensional structure. Each of the memory blocks includes a plurality of memory cells stacked on a substrate. The plurality of memory cells are arranged in a +X-axis direction, a +Y-axis direction, and a +Z-axis direction. A structure of each of the memory blocks will be described in more detail with reference to FIG. 3.

Figure 3:
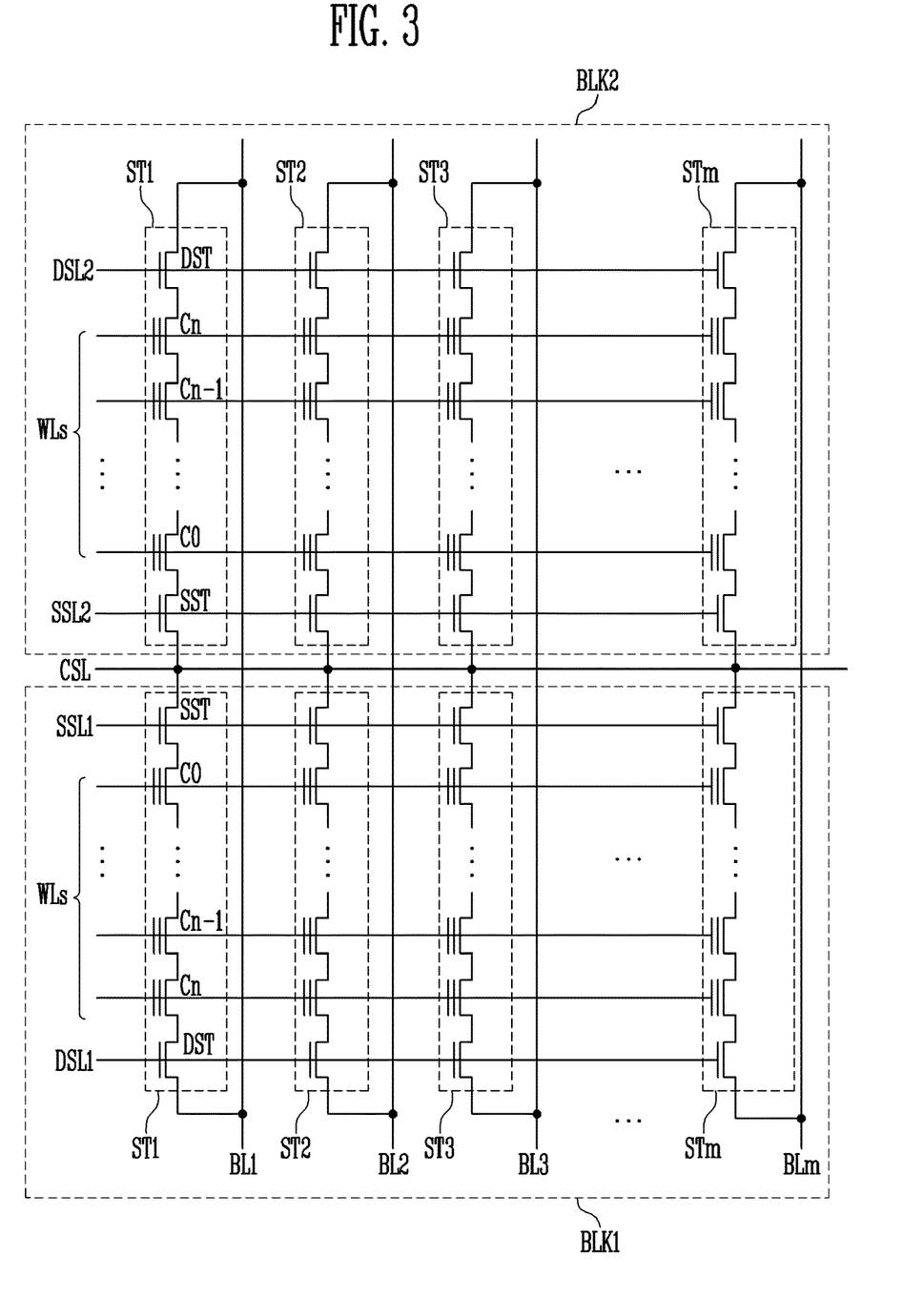
FIG. 3 is a circuit diagram for describing a memory block of FIG. 1.

FIG. 3 is a circuit diagram for describing the memory blocks of FIG. 1.

In FIG. 1, it is illustrated that the plurality of memory blocks BLK1 to BLKz are connected with the read and write circuit 130 through the bit lines BL1 to BLm, but in FIG. 3, for the purpose of illustration and description of the drawings, the memory block BLK1 and the memory block BLK2 are representatively illustrated. The memory block BLK1 and the memory block BLK2 have structures sharing the bit lines BL1 to BLm and a common source line CSL.

Referring to FIG. 3, the memory block BLK1 and the memory block BLK2 are connected to the plurality of bit lines BL1 to BLm.

The memory block BLK1 includes the plurality of cell strings ST1 to STm. The plurality of cell strings ST1 to STm is connected between the plurality of bit lines BL1 to BLm and the common source line CSL, respectively. Each of the plurality of cell strings ST1 to STm includes a source select transistor SST, a plurality of serially connected memory cells C0 to Cn, and a drain select transistor DST. The source select transistor SST is connected to a source select line SSL1. The plurality of memory cells C0 to Cn is connected to the word lines WLs, respectively. The drain select transistor DST is connected to a drain select line DSL1. The common source line CSL is connected to a source side of the source select transistor SST. Each of the bit lines BL1 to BLm is connected to a drain side of the corresponding drain select transistor DST.

The memory block BLK2 may be formed in a similar structure to that of the memory block BLK1. That is, the memory block BLK2 includes a plurality of cell strings ST1 to STm, and the plurality of cell strings ST1 to STm is connected between the plurality of bit lines BL1 to BLm and the common source line CSL, respectively. Each of the plurality of cell strings ST1 to STm includes a source select transistor SST, a plurality of serially connected memory cells C0 to Cn, and a drain select transistor DST. The source select transistor SST is connected to a source select line SSL2. The plurality of memory cells C0 to Cn is connected to the word lines WLs, respectively. The drain select transistor DST is connected to a drain select line DSL2. The common source line CSL is connected to a source side of the source select transistor SST. Each of the bit lines BL1 to BLm is connected to a drain side of the corresponding drain select transistor DST.

As described above, the memory block BLK1 and the memory block BLK2 are formed in similar structures, and the drain select lines DSL1 and DSL2 and the source select lines SSL1 and SSL2 connected to the memory block BLK1 and the memory block BLK2, respectively, may be designed to have electrically isolated structures.

Figure 4:
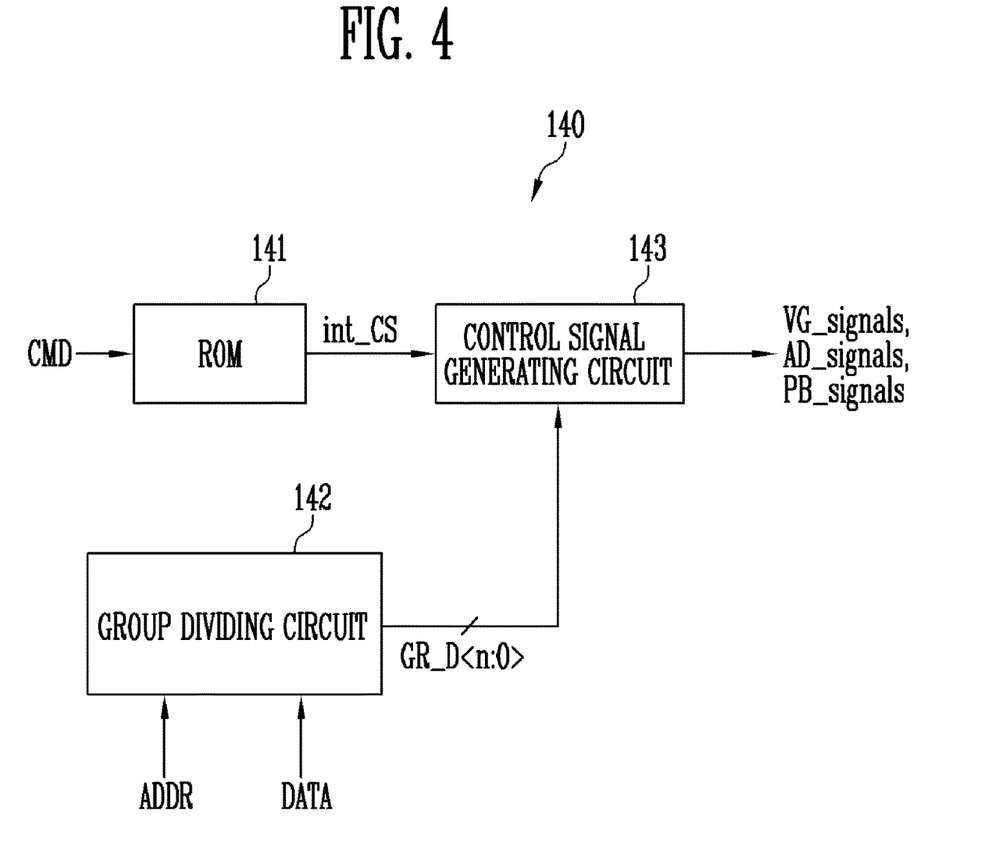
FIG. 4 is a block diagram illustrating an example embodiment of a control logic of FIG. 1.

FIG. 4 is a block diagram illustrating an example embodiment of the control logic of FIG. 1.

Referring to FIG. 4, the control logic 140 may include a ROM 141, a group dividing circuit 142, and a control signal generating circuit 143.

An algorithm for performing various operations (a program operation, a read operation, an erase operation, and the like) of the semiconductor memory device may be stored in the ROM 141. The ROM 141 outputs an internal control signal int_CS in response to a command CMD input from a host Host connected with the semiconductor memory device.

The group dividing circuit 142 generates and outputs a plurality of group dividing signals GR_D<n:0> according to data DATA input from the outside and an address ADDR during the program operation. The group dividing circuit 142 groups the data DATA into two or more program groups according to a program state corresponding to the input data DATA, and generates and outputs the plurality of group dividing signals GR_D<n:0> based on an address ADDR of the data DATA corresponding to each program group. Accordingly, the plurality of group dividing signals GR_D<n:0> may include the program group and the address information of the corresponding data.

The control signal generating circuit 143 outputs the plurality of control signals VG_signals, AD_signals, and PB_signals for controlling the peripheral circuit (the voltage generating circuit 150, the address decoder 120, and the read and write circuit 130 of FIG. 1) in response to the internal control signal int_CS. Particularly, the control signal generating circuit 143 outputs the control signals PB_signals for controlling the read and write circuit 130 to divide and perform a program operation of data corresponding to a first program group and a program operation of data corresponding to a second program group in response to the internal control signal int_CS and the plurality of group dividing signals GR_D<n:0>. For example, the control signal generating circuit 143 outputs the control signals PB_signals for controlling the pages buffers of the read and write circuit, which temporarily stores data corresponding to a second program group, to apply a program inhibition voltage to a corresponding bit line during a program operation of data corresponding to the first program group, and controlling the pages buffers of the read and write circuit, which temporarily stores data corresponding to the first program group, to apply a program inhibition voltage to a corresponding bit line during a program operation of data corresponding to the second program group.

Figure 5:
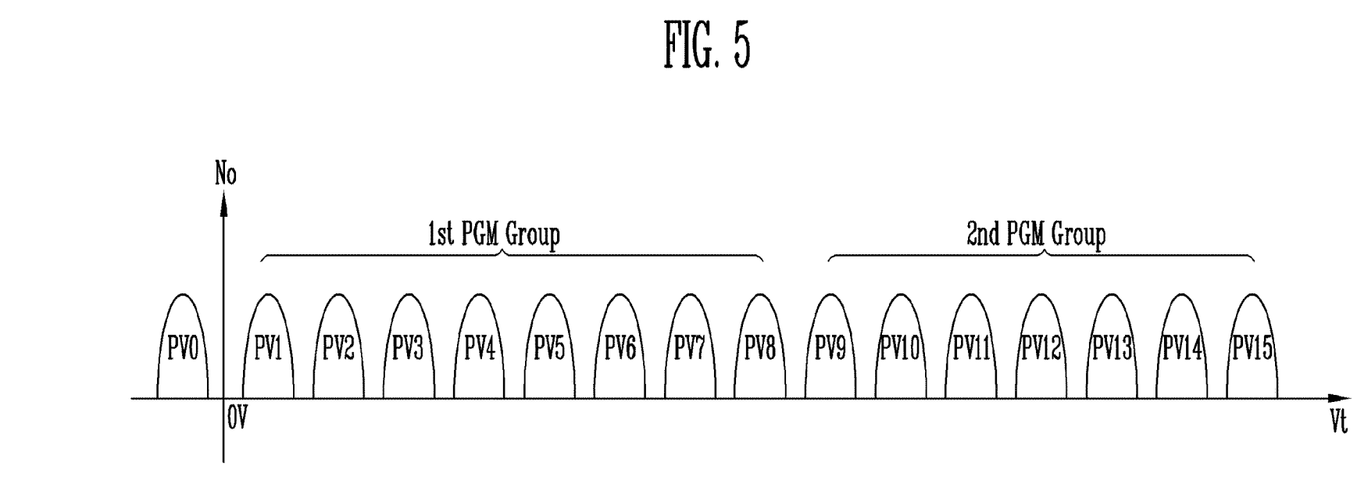
FIG. 5 is a diagram of a threshold voltage distribution according to a program state according to an example embodiment of the present disclosure.

FIG. 5 is a diagram of a threshold voltage distribution according to a program state according to an example embodiment of the present disclosure.

Figure 6:
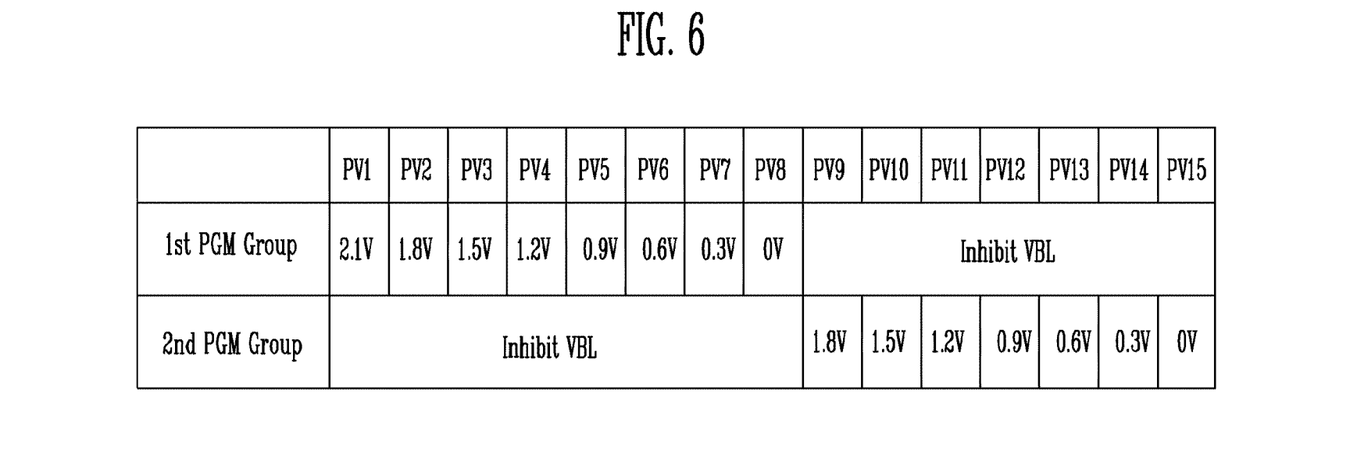
FIG. 6 is a diagram for describing a bit line voltage during a program operation according to an example embodiment of the present disclosure.

FIG. 6 is a diagram for describing a bit line voltage during a program operation according to an example embodiment of the present disclosure.

Figure 7:
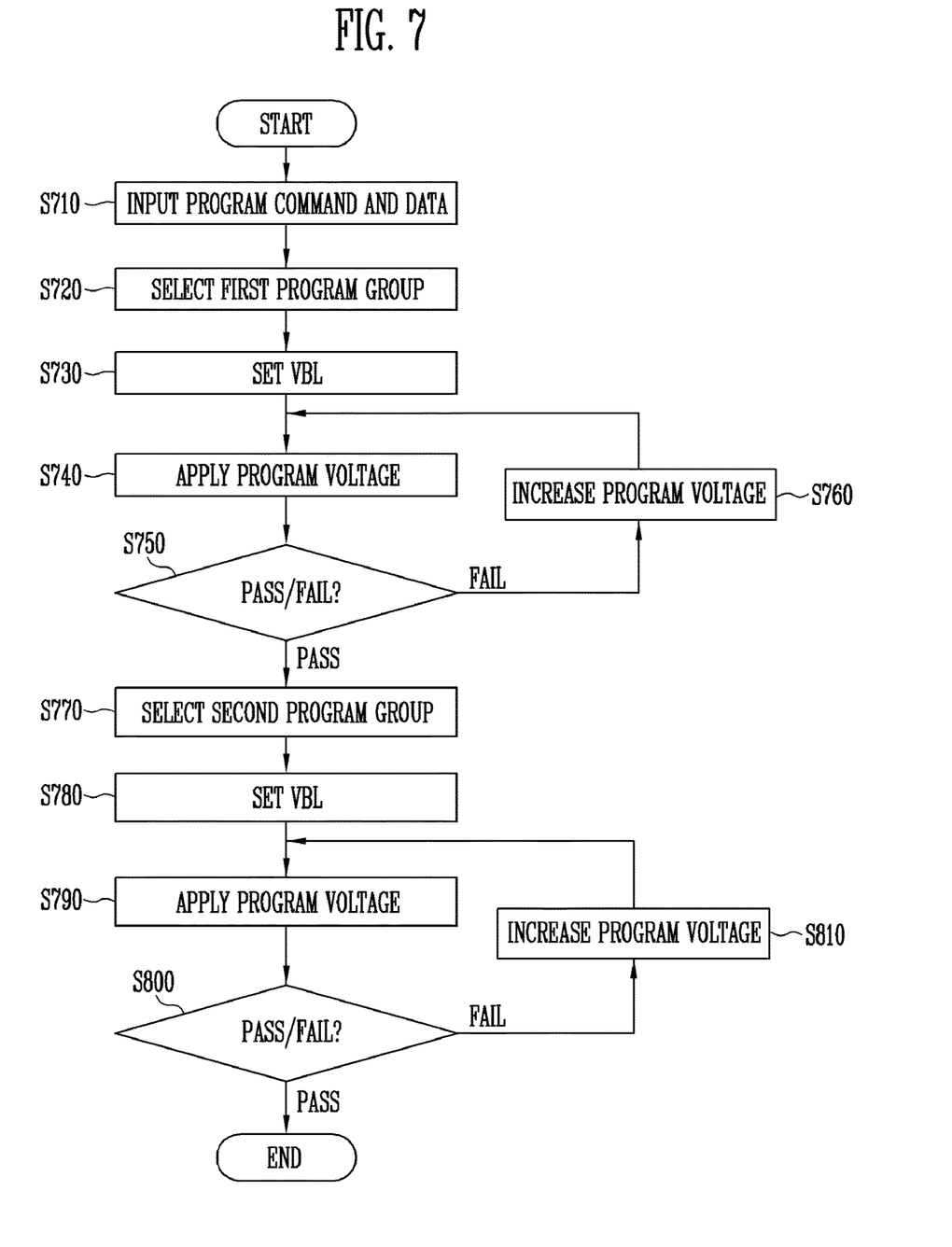
FIG. 7 is a flowchart for describing a program operation method of the semiconductor memory device according to an example embodiment of the present disclosure.

FIG. 7 is a flowchart for describing a program operation method of the semiconductor memory device according to an example embodiment of the present disclosure.

An operating method of the semiconductor memory device according to the example embodiment of the present disclosure will be described with reference to FIGS. 1 to 7.

In the example embodiment of the present disclosure, a case where data is defined into two program groups according to a program state and a program operation as performed is described as an example, but the present disclosure is not limited thereto. That is, the data may be defined into two or more program groups and a program operation may be performed. Further, in the example embodiment of the present disclosure, a Quad Level Cell (QLC) program scheme is described, but the present disclosure is not limited thereto, the present disclosure is also applicable to a Tri-Level Cell (TLC) program scheme and a Multi-Level Cell (MLC) program scheme.

When a command CMD for a program command and data DATA are input from outside (S710) the semiconductor device 100 and is received by the control logic 140, the ROM 141 of the control logic 140 generates and outputs an internal control signal int_CS according to the input command CMD. The internal control signal int_CS may correspond to an algorithm of a program operation. The control signal generating circuit 143 generates control signals PB_signals in response to the internal control signal int_CS. Also, the read and write circuit 130 temporarily stores the data DATA in response to the control signals PB_signals, where the data DATA may be input from outside the read write circuit 130.

The group dividing circuit 142 of the control logic 140 groups the data into two groups according to the input data DATA and the address ADDR based on a program state, and outputs the plurality of group dividing signals GR_D<n:0>.

The grouping of the data into the two groups according to the program is illustrated in FIG. 5. Referring to FIG. 5, the QLC program scheme may have program states PV0 to PV15 according to data, and the remaining program states PV1 to PV15, in which an erase state PV0 is excluded, are grouped into a first program group $1^{st}$ PGM group and a second program group $2^{nd}$ PGM group. In this case, one program group may be formed of the program states, in which threshold voltage distributions are adjacent to one another. Further, the program states included in the first program group $1^{st}$ PGM group may have lower threshold voltages than those of the program states included in the second program group $2^{nd}$ PGM group. In one example, the control logic 140 may control the peripheral circuit 170 to group program states PV1 to PV15 into the first program group $1^{st}$ PGM group and the second program group $2^{nd}$ PGM group.

In the present example embodiment of the present disclosure, the data corresponding to the program states PV1 to PV8 may be defined as the first program group $1^{st}$ PGM group, and the data corresponding to the program states PV9 to PV15 may be defined as the second program group $2^{nd}$ PGM group. Further, in the present example embodiment, the control logic 140 may control the peripheral circuit 170 to perform a program operation for the first program group $1^{st}$ PGM group having a relatively low threshold voltage distribution which is performed first, and a program operation for the second program group $2^{nd}$ PGM group having a relatively higher threshold voltage distribution which is performed later.

The control signal generating circuit 143 of the control logic 140 generates and outputs the control signals PB_signals in response to the internal control signal int_CS and the plurality of group dividing signals GR_D<n:0>. The read and write circuit 130 applies a program allowable voltage when the temporarily stored data corresponds to the first program group $1^{st}$ PGM group and applies a program inhibition voltage when the temporarily stored data corresponds to the second program group $2^{nd}$ PGM group where the read and write circuit 130 may perform a first program group selecting operation (S720) in response to the control signals PG_signals. In other words, the read write circuit 130 may apply a program inhibition voltage to the bit lines corresponding to page buffers associated with the second program group $2^{nd}$ PGM group which correspond to the unselected program group during the program operation for the selected program group.

In the present example embodiment of the present disclosure, the program group is grouped into the first program group and the second program group, but may be grouped into two or more program groups. For example, when data is grouped into three program groups in the QLC program scheme, the data corresponding to the program states PV1 to PV5 may be grouped into a first program group, the data corresponding to the program states PV6 to PV10 may be grouped into a second program group, and the data corresponding to the program states PV11 to PV15 may be grouped into a third program group.

Further, the page buffers, in which data corresponding to the first program group $1^{st}$ PGM group is temporarily stored, among the page buffers PB1 to PBm may be adjusted by a bit line voltage VBL according to the program state corresponding to the temporarily stored data as illustrated in FIG. 6 (S730). In other words, the read write circuit 130 may apply the plurality of program allowable voltages, which may correspond to the program states included in the first program group $1^{st}$ PGM group, respectively to bit lines corresponding to the page buffers.

For example, the read write circuit 130 may apply the lowest program allowable voltage (for example, 0 V) to the bit line corresponding to the corresponding page buffer, which may include data corresponding to the program state PV8 that is the highest program state in the first program group $1^{st}$ PGM group. Further, the read write circuit 130 may apply the highest program allowable voltage (for example, 2.1V) to the bit line corresponding to the corresponding page buffer, which may include data corresponding to the program state PV1 that is the lowest program state in the first program group $1^{st}$ PGM group. That is, during the program operation when data has a lower program state in the first program group $1^{st}$ PGM group, a potential level of the program allowable voltage applied to the bit line is adjusted to be relatively high, and when data has a higher program state in the first program group $1^{st}$ PGM group, a potential level of the program allowable voltage applied to the bit line is adjusted to be relatively low.

In this case, the program allowable voltages may be lower than the program inhibition voltage. In other words, the program allowable voltages may have a lower potential than a potential level of the program inhibition voltage.

Then, the control logic 140 controls the peripheral circuit 170 to perform a program voltage applying operation S740 of the semiconductor memory device. The voltage generating circuit 150 generates a program voltage Vpgm and a pass voltage Vpass to be applied to a selected memory block (for example, BLK1) in response to the control signals VG_signals. The address decoder 120 applies the program voltage Vpgm to a selected word line of the selected memory block BLK1 and applies the pass voltage Vpass to unselected word lines of the selected memory block BLK1 in response to the address decoder 120 receiving the control signals AD_signals from the control logic 140.

In this case, the program allowable voltage applied to the bit lines is adjusted according to the data to be programmed so that the memory cells, in which data included in the first program group $1^{st}$ PGM group is programmed, may be programmed at a uniform program speed. That is, the program operations may be performed so that the memory cells are programmed to the program states PV1 to PV8, and program completion times are uniform. That is, the control logic 140 may control the peripheral circuit 170 to simultaneously program the memory cells to the program states PV1 to PV8.

After performing the program voltage applying operation S740, the control logic 140 controls the peripheral circuit 170 to perform a program verify operation S750. The read and write circuit 130 precharges the potential levels of the bit lines BL1 to BLm to a predetermined level in response to the control signals PB_signals. The voltage generating circuit 150 generates a verify voltage Vverify and a pass voltage Vpass to be applied to a selected memory block (for example, BLK1) in response to the control signals VG_signals received from the control logic 140. The address decoder 120 applies the verify voltage Vverify to a selected word line of the selected memory block BLK1 and applies the pass voltage Vpass to unselected word lines of the selected memory block BLK1 in response to the control signals AD_signals received from the control logic 140. Then, the read and write circuit 130 senses potential levels or current quantities of the bit lines BL1 to BLm in response to the control signals PB_signals and determines whether the program operation passed or failed. In this case, the program verify operation may be selectively performed only on the page buffers in which the data corresponding to the first program group $1^{st}$ PGM group is temporarily stored, among the page buffers PB1 to PBm.

When it is determined that the program operation has failed as a result of the program verify operation S750, the control logic 140 controls the voltage generating circuit 150 to generate a new program voltage which is higher than the program voltage generated during the program voltage applying operation S740 by a step voltage (S760), and controls the peripheral circuit 170 so that the method is re-performed from the program voltage applying operation S740.

When it is determined that the program operation passed as a result of the program verify operation S750, a second program group selecting operation S770 is performed. The control signal generating circuit 143 of the control logic 140 generates and outputs the control signals PB_signals in response to the internal control signal int_CS and the plurality of group dividing signals GR_D<n:0>. The read and write circuit 130 applies a program allowable voltage when the temporarily stored data corresponds to the second program group $2^{nd}$ PGM group and applies a program inhibition voltage when the temporarily stored data corresponds to the first program group $1^{st}$ PGM group in response to the control signals PB_signals to perform a second program group selecting operation.

Further, the page buffers, in which data corresponding to the second program group $2^{nd}$ PGM group is temporarily stored, among the page buffers PB1 to PBm may be adjusted by the bit line voltage VBL according to the program state corresponding to the temporarily stored data as illustrated in FIG. 6 (S780). In other words, the read write circuit 130 may apply the plurality of program allowable voltages, which may correspond to the program states included in the second program group $2^{nd}$ PGM group, respectively to bit lines corresponding to the page buffers.

For example, the read write circuit 130 may apply the lowest program allowable voltage (for example, 0 V) to the bit line corresponding to the corresponding page buffer which may include data corresponding to the program state PV15 that is the highest program state in the second program group $2^{nd}$ PGM group. Further, the read write circuit 130 may apply the highest program allowable voltage (for example, 1.8 V) to the bit line corresponding to the corresponding page buffer which may include data corresponding to the program state PV9 that is the lowest program state in the second program group $2^{nd}$ PGM group. That is, during the program operation when data has a lower program state in the second program group $2^{nd}$ PGM group, a potential level of the program allowable voltage applied to the bit line is adjusted to be relatively high, and when data has a higher program state in the second program group $2^{nd}$ PGM group, a potential level of the program allowable voltage applied to the bit line is adjusted to be relatively low.

In this case, the program allowable voltages may be lower than the program inhibition voltage. In other words, the program allowable voltages may have a lower potential than a potential level of the program inhibition voltage.

Then, the control logic 140 controls the peripheral circuit 170 to perform a program voltage applying operation S790 of the semiconductor memory device. The voltage generating circuit 150 generates a program voltage Vpgm and a pass voltage Vpass to be applied to a selected memory block (for example, BLK1) in response to the control signals VG_signals. The address decoder 120 applies the program voltage Vpgm to a selected word line of the selected memory block BLK1 and applies the pass voltage Vpass to unselected word lines of the selected memory block BLK1 in response to the address decoder 120 receiving the control signals AD_signals from the control logic 140.

In this case, the program allowable voltage applied to the bit lines is adjusted according to the data to be programmed so that the memory cells, in which data included in the second program group $2^{nd}$ PGM group is programmed, may be programmed at a uniform program speed. That is, the program operation may be performed so that the memory cells are programmed to the program states PV9 to PV15, and the program completion times are uniform. That is, the control logic 140 may control the peripheral circuit 170 to simultaneously program the memory cells to the program states PV9 to PV15.

After performing the program voltage applying operation S790, the control logic 140 controls the peripheral circuit 170 to perform a program verify operation S800. The read and write circuit 130 precharges the potential levels of the bit lines BL1 to BLm to a predetermined level in response to the control signals PB_signals. The voltage generating circuit 150 generates a verify voltage Vverify and a pass voltage Vpass to be applied to the selected memory block (for example, BLK1) in response to the control signals VG_signals received from the control logic 140. The address decoder 120 applies the verify voltage Vverify to a selected word line of the selected memory block BLK1 and applies the pass voltage Vpass to unselected word lines of the selected memory block BLK1 in response to the control signals AD_signals received from the control logic 140. Then, the read and write circuit 130 senses potential levels or current quantities of the bit lines BL1 to BLm in response to the control signals PB_signals and determines whether the program operation passed or failed. In this case, the program verify operation may be selectively performed only on the page buffers in which the data corresponding to the second program group $2^{nd}$ PGM group is temporarily stored, among the page buffers PB1 to PBm.

When it is determined that the program operation has failed as a result of the program verify operation S800, the control logic 140 controls the voltage generating circuit 150 to generate a new program voltage which is higher than the program voltage generated during the program voltage applying operation S790 by a step voltage (S810), and controls the peripheral circuit 170 so that the method is re-performed from the program voltage applying operation S790.

When it is determined that the program operation passed as a result of the program verify operation S800, the program operation for the selected page is terminated, and a program operation is performed on a next page. In the program operation for the next page, the foregoing operations S710 to S810 may be sequentially performed.

As described above, according to the example embodiment of the present disclosure, data corresponding to the plurality of program states are grouped into a plurality of program groups and the respective program groups are sequentially programmed, and data included in the program group are simultaneously programmed in the memory cells, thereby improving an operation speed of the program operation.

Figure 8:
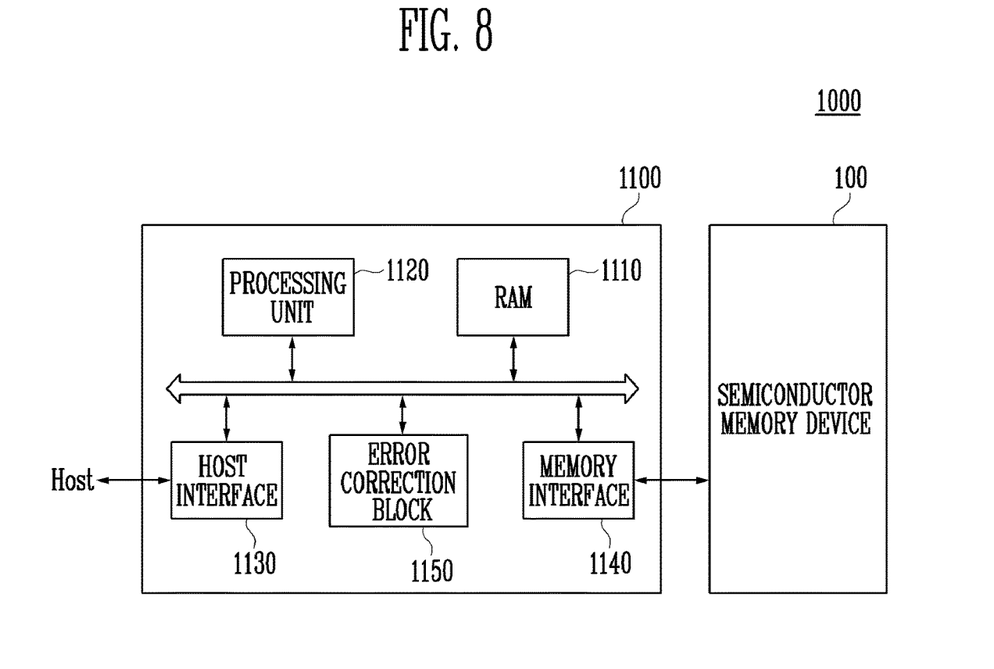
FIG. 8 is a block diagram illustrating a memory system including the semiconductor memory device of FIG. 1.

Referring to FIG. 8, a memory system 1000 includes a semiconductor memory device 100 and a controller 1100.

The semiconductor memory device 100 may be configured and operated in a similar manner to that described with reference to FIG. 1. Hereinafter, overlapping descriptions will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a Random Access Memory (RAM) 1110, a processing unit 1120, a host interface 1130, a memory interface 1140, and an error correction block 1150. The RAM 1110 is used as at least one working memory of the processing unit 1120, a cache memory between the semiconductor memory device 100 and the host Host, and a buffer memory between the semiconductor memory device 100 and the host Host. The processing unit 1120 controls a general operation of the controller 1100. Further, the controller 1100 may temporarily store program data provided from the host Host during the write operation.

The host interface 1130 includes a protocol for performing a data exchange between the host Host and the controller 1100. As an exemplified embodiment, the controller 1100 is configured to communicate with the host Host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, and an Integrated Drive Electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error of data received from the semiconductor memory device 100 by using an Error Correction Code (ECC). The processing unit 1120 may control the semiconductor memory device 100 to adjust a read voltage according to a result of the error detection of the error correction block 1150 and perform a re-read operation. As an example embodiment, the error correction block may be provided as a constituent element of the controller 1100.

The controller 1100 and the semiconductor memory device 100 may be integrated into one semiconductor device. As an example embodiment, the controller 1100 and the semiconductor memory device 100 may be integrated into one semiconductor device to configure a memory card. For example, the controller 1100 and the nonvolatile memory device 100 may be integrated as one semiconductor device to configure a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 100 may be integrated into one semiconductor device to configure a semiconductor drive (Solid State Drive (SSD)). The semiconductor drive (SSD) includes a storage device configured to store data in a semiconductor memory. In a case where the memory system 1000 is used as the SSD, a speed of the operation of the host Host connected to the memory system 1000 is remarkably improved.

For another example, the memory system 1000 is provided as one of various constituent elements of an electronic device, such as a computer, an ultra mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensiona television, a digital audio recorder, a digital audio player, a digital picture recorder, a digital picture player, a digital video recorder, a digital video player, a device capable of transceiving information in a wireless environment, one of various electronic devices configuring a home network, one of various electronic devices configuring a computer network, one of various electronic devices configuring a telematics network, an RFID device, or one of various constituent element devices configuring a computing system.

As an example embodiment, the semiconductor memory device 100 or the memory system 1000 may be mounted in various types of package. For example, the semiconductor memory device 100 or the memory system 1000 may be packaged and embedded by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 9:
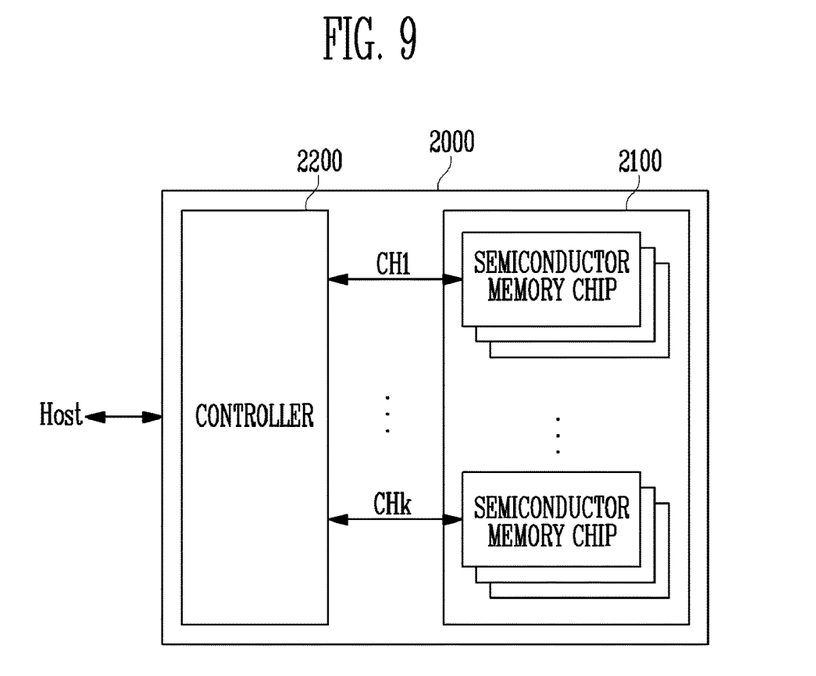
FIG. 9 is a block diagram illustrating an application example of the memory system of FIG. 8.

FIG. 9 is a block diagram illustrating an application example of the memory system of FIG. 8.

Referring to FIG. 9, the memory system 2000 includes a semiconductor memory device 2100 and a controller 2200. The semiconductor memory device 2100 includes a plurality of semiconductor memory chips. The plurality of semiconductor memory chips is divided into a plurality of groups.

In FIG. 9, it is illustrated that the plurality of groups communicates with the controller 2200 through first to $k^{th}$ channels CH1 to CHk, respectively. Each semiconductor memory chip may be configured and operated in a similar manner to that of one in the semiconductor memory device 100 described with reference to FIG. 1.

Each group is configured to communicate with the controller 2200 through one common channel. The controller 2200 is configured in a similar manner to the controller 1100 described with reference to FIG. 8, and is configured to control the plurality of memory chips of the semiconductor memory device 2100 through the plurality of channels CH1 to CHk.

Figure 10:
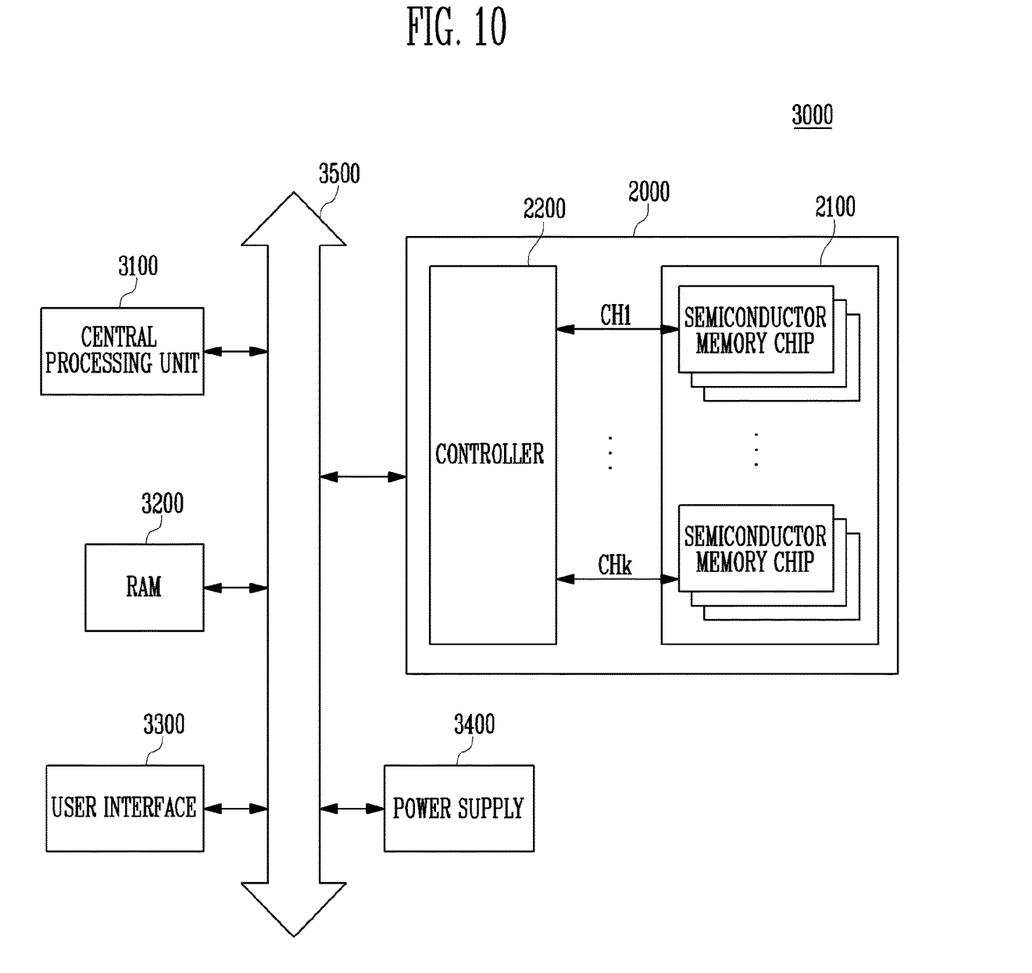
FIG. 10 is a block diagram illustrating a computing system including the memory system described with reference to FIG. 9.

FIG. 10 is a block diagram illustrating a computing system including the memory system described with reference to FIG. 9.

Referring to FIG. 10, the computing system 3000 includes a central processing unit 3100, a Random Access Memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 10, it is illustrated that the semiconductor memory device 2100 is connected to the system bus 3500 through the controller 2200. However, the semiconductor memory device 2100 may be configured to be directly connected to the system bus 3500. In this case, a function of the controller 2200 may be performed by the central processing unit 3100 and the RAM 3200.

In FIG. 10, it is illustrated that the memory system 2000 described with reference to FIG. 9 is provided. However, the memory system 2000 may be substituted with the memory system 1000 described with reference to FIG. 8. As an example embodiment, the computing system 3000 may be configured to include all of the memory systems 1000 and 2000 described with reference to FIGS. 8 and 9.

The detailed description of the present disclosure includes the description of the particular example embodiments, but various modifications are available within the scope of the present disclosure without departing from the scope and the technical spirit of the present disclosure. Therefore, the scope of the present disclosure shall not be limited to the example embodiments described, but shall be defined by the claims to be described below and the equivalents to the claims.

What is claimed is:

1. A semiconductor memory device, comprising:
a memory cell array including a plurality of memory cells which are programmed to a plurality of program states;
a peripheral circuit configured to perform a program operation on the memory cell array; and
a control logic configured to control the peripheral circuit to divide the plurality of program states into two or more program groups and sequentially program the two or more program groups during the program operation,
wherein the control logic controls the peripheral circuit to simultaneously program the memory cells which are to be programmed to program states included in the same program group among the plurality of memory cells, and
wherein the control logic controls the peripheral circuit to first perform a program operation on a first program group having a lower threshold voltage distribution than a second program group among the two or more program groups, and second perform a program operation on the second program group having a higher threshold voltage distribution than the first program group.

2. The semiconductor memory device of claim 1, wherein the peripheral circuit includes a read and write circuit connected with bit lines of the memory cell array, and
the read and write circuit applies a plurality of program allowable voltages to first bit lines corresponding to a selected program group among the two or more program groups.

3. The semiconductor memory device of claim 2, wherein the read and write circuit applies the plurality of program allowable voltages which correspond to the program states included in the selected program group, respectively, to the first bit lines.

4. The semiconductor memory device of claim 2, wherein the read and write circuit applies a program inhibition voltage to second bit lines corresponding to a remaining unselected program group, not including the selected program group.

5. The semiconductor memory device of claim 4, wherein the plurality of program allowable voltages has a lower potential level than a potential level of the program inhibition voltage.

6. The semiconductor memory device of claim 1, wherein each of the two or more program groups includes adjacent program states among the plurality of program states.

7. A semiconductor memory device, comprising:
a memory cell array including a plurality of memory cells which are programmed to a plurality of program states;
a peripheral circuit configured to perform a program operation on the memory cell array; and
a control logic configured to control the peripheral circuit to group the plurality of program states into a first program group and a second program group, and perform a program operation on the first program group and then perform a program operation on the second program group during the program operation,
wherein the control logic groups program states, which have low threshold voltage distributions and are adjacent to one another, among the plurality of program states into the first program group, and groups program states, which have relatively higher threshold voltage distributions than the low threshold voltage distributions and are adjacent to one another, among the plurality of program states into the second program group.

8. The semiconductor memory device of claim 7, wherein the control logic simultaneously programs first memory cells to be programmed to the program states included in the first program group among the plurality of memory cells, and simultaneously programs second memory cells to be programmed to the program states included in the second program group among the plurality of memory cells.

9. The semiconductor memory device of claim 8, wherein the peripheral circuit includes a read and write circuit connected with bit lines of the memory cell array, and
the read and write circuit applies a plurality of program allowable voltages to first bit lines corresponding to a selected program group between the first program group and the second program group.

10. The semiconductor memory device of claim 9, wherein the read and write circuit applies the plurality of program allowable voltages which correspond to the program states included in the selected program group, respectively, to the first bit lines.

11. The semiconductor memory device of claim 9, wherein the read and write circuit applies a program inhibition voltage to second bit lines corresponding to an unselected program group between the first program group and the second program group.

12. The semiconductor memory device of claim 11, wherein the plurality of program allowable voltages has a lower potential level than a potential level of the program inhibition voltage.

13. The semiconductor memory device of claim 9, wherein when a first program state to be programmed has a higher threshold voltage than a second program state, the read and write circuit applies a lower program allowable voltage among the plurality of program allowable voltages to a bit line corresponding to the first program state than applied to a bit line corresponding to the second program state, and when the first program state to be programmed has a lower threshold voltage than the second program state, the read and write circuit applies a higher program allowable voltage among the plurality of program allowable voltages to the bit line corresponding to the first program state than applied to the bit line corresponding to the second program state.

14. A method of operating a semiconductor memory device, the method comprising:

receiving a plurality of data to be programmed from the outside the semiconductor device, and storing the received data in a read and write circuit connected with bit lines of a memory cell array;

grouping the plurality of data into a plurality of program groups;

performing a program operation on a selected program group among the plurality of program groups; and when a program operation for the selected program group is completed, performing a program operation on a next program group, wherein the grouping of the plurality of data into the plurality of program groups includes grouping the plurality of data into the plurality of program groups according to a plurality of program states corresponding to the plurality of data and grouping the program states having threshold voltage distributions adjacent to one another into one program group.

15. The method of claim 14, wherein a program inhibition voltage is applied to second bit lines corresponding to a unselected program group among the bit lines during the program operation for the selected program group.

* * * * *